United States Patent [19]

Warabisako et al.

[11] Patent Number: 4,695,856

[45] Date of Patent: Sep. 22, 1987

[54] SEMICONDUCTOR DEVICE

[75] Inventors: Terunori Warabisako, Nishitama; Makoto Ohkura, Hachioji, both of Japan; Masanobu Miyao, Amsterdam, Netherlands

[73] Assignee: Hitachi, Ltd., Tokyo, Japan

[21] Appl. No.: 642,258

[22] Filed: Aug. 20, 1984

[30] Foreign Application Priority Data

Aug. 19, 1983 [JP] Japan .................. 58-150149

[51] Int. Cl.[4] .......................................... H01L 27/12
[52] U.S. Cl. ..................................... 357/4; 357/23.7; 357/71
[58] Field of Search .................. 357/71, 59, 68, 55, 357/53, 4, 23.7, 54

[56] References Cited

U.S. PATENT DOCUMENTS

| | | | |
|---|---|---|---|
| 3,373,323 | 3/1968 | Wolfrum et al. | 357/53 |
| 3,393,088 | 7/1968 | Manasevit | 357/49 |
| 3,484,662 | 12/1969 | Hagon | 357/4 |
| 4,146,902 | 3/1979 | Tanimoto et al. | 357/59 |
| 4,185,294 | 1/1980 | Sumitomo | 357/54 |
| 4,199,777 | 4/1980 | Maruyama | 357/71 |
| 4,404,735 | 9/1983 | Sakurai | 357/55 |
| 4,412,242 | 10/1983 | Herman et al. | 357/53 |

FOREIGN PATENT DOCUMENTS

| | | | |
|---|---|---|---|
| 58-93282 | 6/1983 | Japan | 357/4 |
| 58-153371 | 9/1983 | Japan | 357/23.7 |
| 0202554 | 11/1983 | Japan | 357/71 P |

Primary Examiner—Andrew J. James
Assistant Examiner—Mark Prenty
Attorney, Agent, or Firm—Antonelli, Terry & Wands

[57] ABSTRACT

A semiconductor device, and more particularly a technique for forming the substrate thereof, is provided for the purpose of preventing the occurrence of crystal devects during recrystallization. To accomplish this, while the surface of an insulator on which a material to be recrystallized is flattened, a semiconductor layer which is employed for another use, e.g., the interconnection between elements or the gate electrode of a MOS transistor, is disposed in the insulator. Owing to the flattened insulator, the occurrence of the crystal defects in the recrystallization of the material can be prevented.

3 Claims, 8 Drawing Figures

SEMICONDUCTOR DEVICE

BACKGROUND OF THE INVENTION

This invention relates to a semiconductor device in which a semiconductor thin film is formed on a semiconductor substrate through a main insulator.

A semiconductor device of so-called SOI (Silicon on Insulator) structure, in which a single-crystalline or almost single-crystalline semiconductor thin film is formed on a semiconductor substrate through a main insulator, has advantages as mentioned below, when compared with a semiconductor device which is fabricated using only a semiconductor substrate. The electrical isolation is easy with the semiconductor thin film, and p-type and n-type regions can be freely arranged, so that a semiconductor device of complementary circuitry having an excellent electrical performance can be fabricated. In addition, a higher frequency operation is attained owing to small parasitic capacitances. Further, the semiconductor device can be vertically combined with elements formed on the surface of the substrate and can be integrated with a higher packing density.

Examples of the SOT structure are disclosed in U.S. Pat. Nos. 3,484,662 and 3,393, 088.

Such advantages can be even further enhanced by providing a conductive layer. The conductive layer can be used as the gate of an FET (field effect transistor) disposed on the surface of the semiconductor substrate or an FET disposed under the semiconductor thin film, and also as the interconnection between devices.

FIG. 1 is a sectional view showing a prior-art semiconductor device of the SCI structure. In the figure, numeral 1 designates a single-crystalline silicon substrate of the (100) orientation. On the surface of the substrate 1, regions (not shown) the conductivity types and resistivities of which are controlled are formed in desired patterns. Numeral 2 designates a main Insulator which is disposed on the substrate 1, numeral 3 an opening which is provided in the main insulator 2, and numeral 4 a conductive layer which is formed on the main insulator 2 and which has a desired interconnection pattern. Numeral 5 indicates an insulator which covers the conductive layer 4, and numeral 6 a single-crystalline silicon film which is formed on the main insulator 2. In order to form this Si film 6, a polycrystalline silicon layer is deposited and is thereafter recrystallized by, e. g., scanning a laser beam. At this time, the polycrystalline Si layer becomes equal to or higher than the melting point thereof or a temperature close thereto. In order to ensure the electrical insulation between the Si film 6 and the conductive layer 4 made of a refractory metal or polycrystalline Si while such temperature condition is endured, the conductive layer 4 needs to be covered with the insulator 5 which does not react with the conductive layer 4 at this temperature.

Such semiconductor device, however, cannot attain a favorable performance in many cases. An important reason for this is that defects 7 and 8 appear in the parts of the Si film 6 corresponding to the opening 3 and the step of the conductive layer 4 and bring about an increase in the leakage current and a decrease in the mobility.

By the way, in an n-channel MOS-FET in which a channel region is formed in the flat part of the Si film 6, a mobility of at least 600 $cm^2/V \cdot s$ is attained in the flat part, whereas a mobility of only about 400 $cm^2/V \cdot s$ is attained in the step part. In addition, when the part of the Si film 6 corresponding to the opening 3 is included in a doped region, the defects 7 pose no problem. In contrast, since the part of the Si film 6 corresponding to the conductive layer 4 is often utilized for an active region, the defects 8 are fatal to the fabrication of an integrated circuit of such construction.

SUMMARY OF THE INVENTION

An object of the present invention is to provide a semiconductor device of good performance.

Another object of the present invention is to decrease the crystal defects of a recrystallized material.

Still another object of the present invention is to efficiently perform the interconnection between elements.

Yet another object of the present invention is to provide a multilayer semiconductor device of high packing density.

In order to accomplish the objects, according to this invention, a conductive layer portion which consists of at least one conductive layer and an insulator covering the conductive layer is embedoedly disposed in at least one of a semiconductor substrate, a main insulator and a semiconductor thin film, and the uppermost edge of the conductive layer portion is rendered substantially even with the upper edge of the semiconductor substrate, the main insulator or the semiconductor thin film in which the conductive layer portion is embedded.

The above and further objects and novel features of the invention will more fully appear from the following detailed description when the same is read in connection with the accompanying drawings. It is to be expressly understood, however, that the drawings are for purpose of illustration only and are not intended as a definition of the limits of the invention.

DETAILED DESCRIPTION OF THE INVENTION

Figure 2:
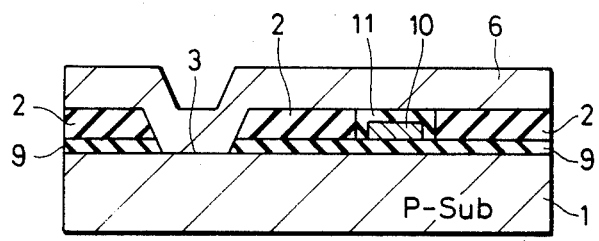
FIG. 2 is a sectional view showing a first embodiment of the present invention.

Embodiment 1:

FIG. 2 is a sectional view illustrative of a semiconductor device according to this invention. Referring to the figure, numeral 9 designates an insulator made of $SiO_2$, which is disposed on a substrate 1 and on which a main insulator 2 is disposed. Numeral 10 indicates a conductive layer which is disposed in a manner to be embedded in the main insulator 2, and numeral 11 an insulator which covers the conductive layer 10. The heights of the main insulator 2 and the covering insulator 11 are substantially equal.

In order to manufacture this semiconductor device, first of all, the surface of a p-type single-crystalline silicon substrate 1 having the (100) face is thermally oxidized, thereby to deposit the insulator 9 which is approximately 1000 Å thick. Subsequently, polycrystalline silicon is deposited to a thickness of 3000 Å by the low-pressure chemical vapor deposition and implanted with $^{31}P+$ ions by $5 \times 10^{15}$ cm$^{-2}$, whereupon the resultant substrate is annealed. Next, the substrate is spin-coated with a negative type photoresist, which is exposed to light. Then, the conductive layer (polyerystalline Si) is etched, thereby to form the conductive layer 10 which is 3 μm wide. At the next step, SiO$_2$ of 3500 Å is deposited by the plasma CVD with the photoresist on the conductive layer 10 left intact, and the SiO$_2$ and photoresist on the conductive layer 10 are removed by the lift-off method, to bring the insulator 2 into a desired pattern.

That is, the photoresist used for the etching of the conductive layer 10 is left till the deposition of SiO$_2$, and after the SiO$_2$ is deposited on the photoresist, it is simultaneously removed by removing the photoresist.

Thus, the SiO$_2$ in only the area conforming in shape with the conductive layer 10 can be removed.

The substrate is thereafter annealed in a dry oxygen atmosphere, whereby the conductive layer 10 is covered with the insulator 11 made of SiO$_2$ having a thickness of 500 Å. That is, the surface of the conductive layer 10 is formed with the thermal oxide layer by the annealing.

Essentially, the conductive layer 10 and the main insulator 2 ought to form no gap. In the actual process, however, the conductive layer 10 is formed to be smaller than the photoresist. This is ascribable to over-etching etc.

Even with the lift-off method, therefore, a gap is formed between the conductive layer 10 and the main insulator 2. This gap can be filled up by the thermal oxidation because the oxide SiO$_2$ has a volume about double that of the original Si.

In this way, the V-shaped gap formed at the boundary between the conductive layer 10 and the main insulator 2 is removed, and simultaneously the insulator 2 is densified. On this occasion, there is almost no step between the upper edge of the insulator 11 and that of the main insulator 2, and the height of the protuberant part of the insulator 11 formed at the boundary between the insulator 2 and the conductive layer 10 is within 200 Å. Next, an opening 3 having a diameter of 30 μm is provided in the oxide 2, 9 by a conventional photoresist process, whereupon a polycrystalline silicon layer having a thickness of 400 Å is deposited by the low-pressure CVD. Subsequently, using a cw laser of argon (Ar) having a power output of 7 W, the polycrystalline Si layer is irradiated with a beam having a spot diameter of about 50 μm while the latter is being scanned at a velocity of 20 cm/sec. Thus, the polycrystalline Si layer is recrystallized by employing as a seed the part of the substrate 1 corresponding to the opening 3, and a single-crystalline silicon film 6 is formed.

When diodes each of which included in its junction area the part of the Si film 6 corresponding to the opening 3 in such semiconductor device, were formed, reverse currents of $10^{-8}$–$10^{-7}$ A/cm$^2$ were exhibited with reverse biases of 1 V. In contrast, when diodes were formed the junction area of each of which existed in the Si film 6 on the conductor layer 10, an improvement of substantially one order was noted on the average.

Figure 3:
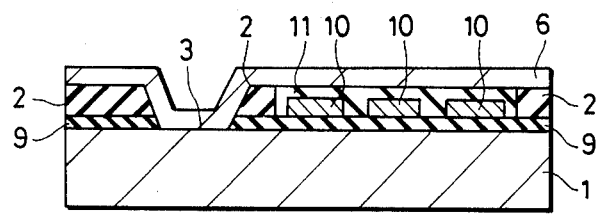
FIG. 3 is a sectional view showing a second embodiment of the present invention.

Embodiment 2:

FIG. 3 is a sectional view showing another embodiment of the present invention. In the figure, the same numerals as in FIG. 2 indicate identical or equivalent portions. The present embodiment consists in that a plurality of conductive layers 10 are formed.

Figure 1:
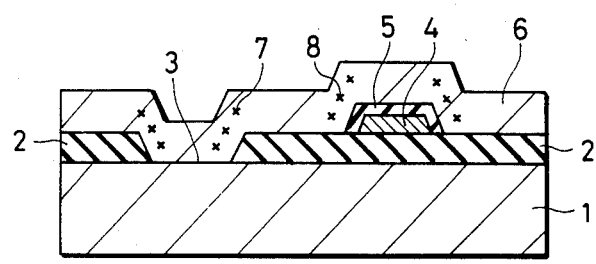
FIG. 1 is a sectional view showing a prior-art semiconductor device.

When, in the prior-art semiconductor device as shown in FIG. 1, a plurality of conductive layers 4 are formed in adjacency, the steps the number of which is double that of the conductive layers 4 appear in the Si film 6. Therefore, when actual characteristics are considered, it is difficult to form the plurality of conductive layers 4 in adjacency. Owing to the application of this invention, no step appears even when the plurality of conductive layers 10 are formed in adjacency as illustrated in FIG. 3.

Therefore, no hindrance is involved in providing a large number of conductive layers 10 in adjacency.

Figure 4:
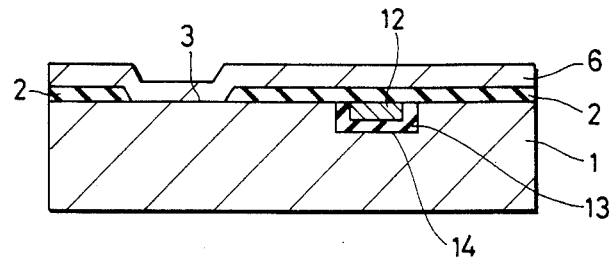
FIG. 4 is a sectional view showing a third embodiment of the present invention.

Embodiment 3:

FIG. 4 is a sectional view illustrative of another semiconductor device according to the present invention, in the figure, numeral 12 indicates a conductive layer which is embedded and disposed in a substrate 1, numeral 13 an insulator which covers the conductive layer 12, numeral 14 a groove which is provided in the substrate 1, numeral 2 an insulator, numeral 3 an opening, and numeral 6 a single-crystallized Si film.

In this case, the thickness of the insulator 2 can be rendered smaller than that of the conductive layer 12.

In manufacturing this semiconductor device, first of all, the groove 14 is provided in the substrate 1 by a conventional dry etching method. Subsequently, an insulator is formed by the plasma CVD, whereupon a polycrystalline Si layer is formed by the low pressure CVD. Next, the polycrystalline Si layer and the insulator except their parts corresponding to the groove 14 are removed by the sputter etching, to form the conductive layer 12 and the insulator 13. On this occasion, almost no step develops between the upper edge of the conductive layer 12 and that of the substrate 1.

Next, after the insulator 2 is formed, the opening 3 is provided. Subsequently, a polycrystalline Si layer is deposited and is recrystallized by a conventional laser annealing method, to form the Si film 6.

Figure 5:
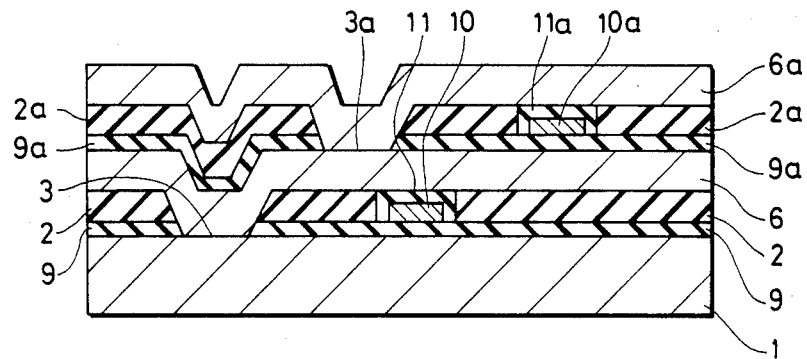
FIG. 5 is a sectional view showing a fourth embodiment of the present invention.

Embodiment 4:

FIG. 5 is a sectional view illustrative of another semiconductor device according to this invention. In the figure, the same numerals as in FIG. 2 indicate identical or equivalent portions. In addition, symbol 9a denotes an insulator which is disposed on the Si film 6, symbol 2a a main insulator which is disposed on the insulator 9a, symbol 3a an opening which is provided in the insulators 2a and 9a, symbol 10a a conductive layer which is embedded and disposed in the insulator 2a, symbol 11a an insulator which covers the conductive layer 10a, and symbol 6a a single-crystalline Si film which is formed on the insulator 2a. The thickness of the insulator 2 or 2a is to such an extent that the crosstalk between the substrate 1 and the Si film 6 or between the Si films 6 and 6a can be prevented.

Device elements can be formed in the respective single-crystalline Si films, and an integrated circuit of high packing density can be formed by the stacked structure. The conductive layers 10 and 10a are used for transmitting signals. Besides, by way of example, the conductive layer 10 can function as the gate of a MOS transistor formed on the substrate 1 and as the gate of a MOS transistor formed on the semiconductor layer 6. In this case, a gate insulator can be realized by adjusting the thickness of the insulator 9 or the insulator 11. Likewise, the conductive layer 10a can be used as the gate of a MOS transistor formed on the semiconductor layer 6 or 6a.

Further, the semiconductor layer 6 or 6a can be turned into a conductor by, for example, heavily doping it with an impurity or changing it into a metal silicide. Then, it can be used as an interconnection member.

Moreover, the respective semiconductor layers are connected through the openings 3, 3a etc. and are easy of electrical connection.

In this manner, a device design of high versatility is permitted by stacking the semiconductor layers.

For fully exploiting the advantages of such structure, it is the requisite that each semiconductor layer has a good crystallinity. It will be readily understood that the flat structure of the present invention is effective for realizing the requisite.

Figure 6:
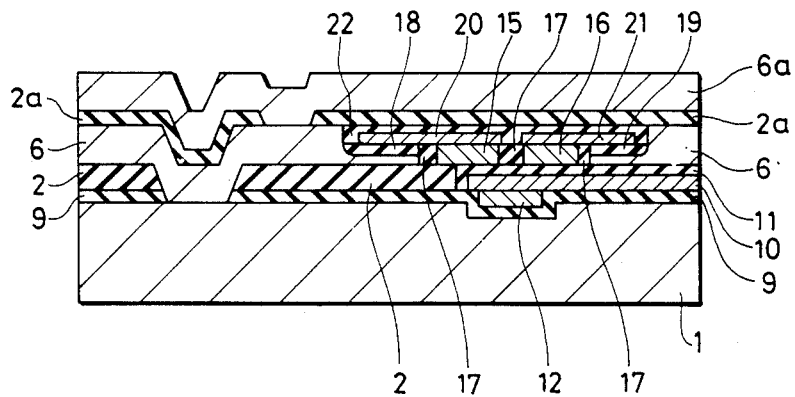
FIG. 6 is a sectional view showing a fifth embodiment of the present invention.

Embodiment 5:

FIG. 6 is a sectional view illustrative of another semiconductor device according to the present invention. In the figure, numerals 15 and 16 indicate conductive layers which are embedded and disposed in a Si film 6. The lengthwise direction of each of the conductive layers 15 and 16 is perpendicular to the sheet of the drawing, and the thickness thereof is not greater than half of the thickness of the Si film 6. Numeral 17 indicates an insulator which covers the side parts of the conductive layers 15 and 16. Numerals 18 and 19 indicate heavily doped regions which are formed in the Si film 6, and which are connected with other elements (not shown) formed in the Si film 6. The connection with the other element may well be in a case where the diffused region 18 or 19 is used as the source, drain or gate of a MOS transistor or where it is used as the base, emitter or collector of a bipolar transistor.

Numerals 20 and 21 designate conductive layers which are embedded and disposed in the Si film 6. The lengthwise direction of each of the conductive layers 20 and 21 is parallel to the sheet of the drawing, and the thickness thereof is not greater than half of the thickness of the Si film 6. Further, the conductive layers 20, 21 serve to connect the conductive layers 15, 16 and the diffused regions 18, 19. Numeral 22 indicates an insulator which covers the conductive layers 20 and 21. The sum of the thicknesses of the conductive layer 15 or 16, the conductive layer 20 or 21 and the insulator 22 is substantially equal to the thickness of the Si film 6. Besides, a conductive layer 12 is connected with elements (not shown) formed on the surface of a substrate 1, and the conductive layer 12 and a conductive layer 10 which is extended orthogonally thereto are connected.

Thus, many of interconnections for connecting the elements formed on the Si film 6 can be formed with the thickness of the Si film 6.

In forming the conductive layers 15, 16, etc. of this semiconductor device, the conductive layers 15, 16 and the insulator 17 are first formed to thicknesses substantially equal to the thickness of the Si film 6, whereupon the parts of the Si film 6 to form the diffused regions 18, 19 therein and the conductive layers 15, 16 and the insulator 17 are simultaneously etched. Next, the diffused regions 18, 19 are formed, whereuopon the conductive layers 20, 21 and the insulator 22 are formed.

The insulator films 17 may be the thermal oxide films of the side surfaces of the conductive layers 15, 16 and the Si film 6.

When a material which cannot be subjected to such an expedient as thermal oxidation is employed for the conductive layers 15, 16, the insulator may well be deposited by the CVD or the like.

While the above embodiments have been explained as to the case where the semiconductor substrate and the semiconductor thin film are made of Si, naturally this invention is also applicable to a semiconductor device which employs a compound semiconductor such as GaAs. In addition, while the above embodiments have been explained as to the case where the conductive layer 10 is made of the polycrystalline Si heavily doped with an impurity, a refractory metal such as molybdenum (Mo) or tungsten (W) or an alloy containing the metal may well be used as the material of the conductive layer. Further, while in the foregoing the single-crystalline Si film 6 has been formed by scanning the laser beam for the recrystallization, the recrystallizing operation may well be performed by scanning an energy beam such as electron beam or by employing a strip heater. Besides, while the polycrystalline Si has been recrystallized in the foregoing, amorphous Si may well be crystallized.

While, in the foregoing, the Si film 6 has been formed using the substrate 1 as the seed, it may well be formed by single-crystallization employing no seed crystal. In this case, it is more advantageous to single-crystallize amorphous Si.

While, in the foregoing embodiment, the upper edge of the insulator 11 or 22 has been rendered even with that of the insulator 2 or Si film 6, the upper edge of the conductive layer 10 or the conductive layer 20 or 21 may well be rendered even with that of the insulator 2 or Si film 6. That is, the step between the upper edge of the insulator 2 or Si film 6 and that of the conductive layer portion may well be rendered within the thickness of the insulator 11 or 22, and it is effective to set the step at or below 1000 Å.

Figure 7A:
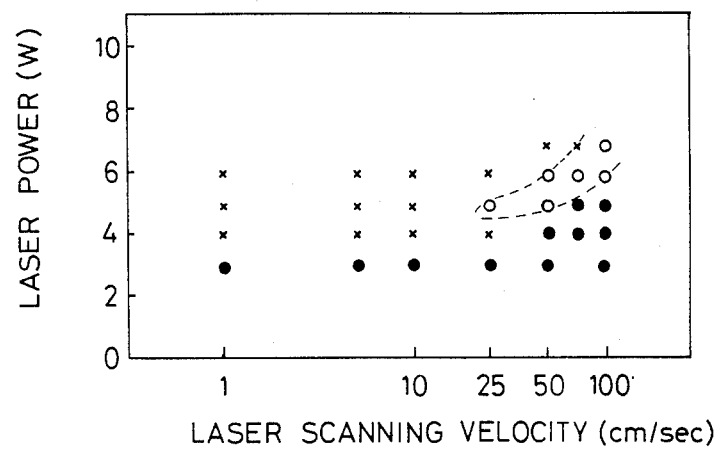
FIGS. 7A and 7B are graphs each showing the relationships between the scanning conditions of a laser and the crystallinity of a single-crystalline Si film.
Figure 7B:
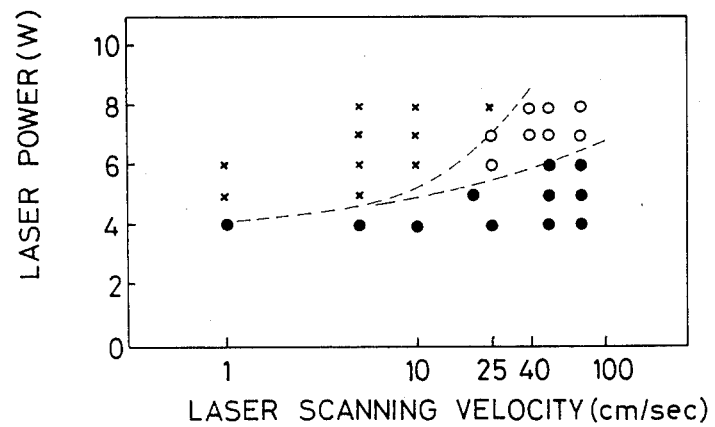

FIGS. 7A and 7B are graphs each showing the relationships among the laser scanning velocity, the laser power and the crystallinity of a single-crystalline Si film in the case where polycrystalline Si was recrystallized in such a way that the polycrystalline Si of 3500 Å thick was deposited on a structure having an oxide step and then scanned by a cw laser of Ar. FIGS. 7A and 7B correspond to cases where the oxide steps were 9500 Å and 3500 Å, respectively. Marks X, ○, and ● indicate that the single-crystalline Si film was broken, that the regrowth of the single-crystalline Si film was favorable, and that the polycrystalline Si did not regrow, respectively. As understood from the graphical representation, in the case of the oxide step of 9500 Å, a good crystal is sometimes obtained even at a laser scanning velocity of 25 cm/sec, but the reproducibility is almost null. In order to attain a favorable crystallinity, the recrystallization needs to be performed under the narrowly limited conditions that the laser scanning velocity is at least 50 cm/sec and that the laser power is near 6 W. Moreover, it cannot be said that the reproducibility is high. In contrast, in the case of the oxide step of 3500 Å, the regrowth of good crystals is possible under the comparatively wide conditions that the laser scanning velocity is at least 40 cm/sec and that the laser power is 6–8 W. The allowable width of the laser power at the laser scanning velocity of 25 cm/sec is about 1 W, and the reproducibility is high. The results will be based on the fact that, depending upon the thickness of the oxide film, the conduction of heat particularly in the direction of the substrate differs to give rise to the differences in the conditions of the recrystallization. As the oxide step becomes smaller, it becomes less influential.

As set forth above, in a semiconductor device according to this invention, steps to appear in the conductive layer portion of a semiconductor thin film are small, and hence, the crystallinity of the semiconductor thin film becomes favorable. This produces the advantage that the electrical performance of the semiconductor thin film is improved. As other advantages, the risks of the breaking of interconnections, etc. at the steps decrease in case of forming the multilayer interconnections, so that the yield is enhanced and that the reliability is improved. In this manner, the effects of the invention are remarkable.

Having described specified embodiments of our bearing, it is believed obvious that modification and variation of our invention is possible in light of the above teachings.

What is claimed is:

1. A semiconductor device comprising:
   a semiconductor substrate;
   a first insulating film which is disposed on said semiconductor substrate;
   a single crystalline semiconductor film which is continuously disposed on both the surface of said semiconductor substrate and a desired portion of said first insulating film;
   a second insulating film which is disposed in a groove provided in said semiconductor substrate; and
   a conductive layer which is disposed between said second insulating film and said first insulating film, wherein said conductive layer and said first and second insulating films are arranged so that said single crystalline semiconductor film will be flat without a stepped portion where it overlies a portion of said first insulating film which overlies said conductive layer and said second insulating film.

2. A semiconductor device comprising:
   a semiconductor substrate;
   a first insulating film disposed on said semiconductor substrate;
   a first single crystalline semiconductor film which is continuously disposed on both the surface of said semiconductor substrate and a desired portion of said first insulating film;
   an impurity doped region which is disposed in said first single crystalline semiconductor film;
   a conductive film at least a part of which is embedded in said single crystalline semiconductor film and which is disposed with a second insulating film interposed between it and said first single crystalline film; and
   a second single crystalline film which is electrically connected with said conductive film and said impurity doped region.

3. A semiconductor device according to claim 2, further comprising a third insulating film formed between said conductive film and said second single crystalline film so that the second single crystalline film will be flat without a stepped portion where it overlies said conductive film and said third insulating film.

* * * * *